United States Patent
Mroz et al.

(10) Patent No.: US 8,641,281 B1
(45) Date of Patent: Feb. 4, 2014

(54) IMPLEMENTING LOW PROFILE FRICTIONAL SLIDE MECHANISM

(75) Inventors: Stephen P. Mroz, Rochester, MN (US); Joseph D. Rico, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/585,203

(22) Filed: Aug. 14, 2012

(51) Int. Cl.
*A47B 88/04* (2006.01)
*F16C 17/26* (2006.01)

(52) U.S. Cl.
USPC ............................ 384/35; 312/334.36; 384/20

(58) Field of Classification Search
USPC ........... 384/7, 20, 21, 23, 26, 42; 312/334.27, 312/334.36; 361/727
See application file for complete search history.

(56) References Cited

U.S. PATENT DOCUMENTS

| | | | |
|---|---|---|---|
| 4,622,194 A * | 11/1986 | Rogers et al. ................. | 264/162 |
| 5,552,946 A | 9/1996 | Bicknese et al. | |
| 5,928,016 A | 7/1999 | Anderson et al. | |
| 7,401,756 B2 * | 7/2008 | Lien et al. ................ | 248/346.07 |
| 2002/0159241 A1 * | 10/2002 | Larsen et al. ................. | 361/756 |
| 2008/0137232 A1 * | 6/2008 | Wadsworth et al. ....... | 360/234.6 |
| 2011/0032665 A1 | 2/2011 | Huang et al. | |
| 2011/0261526 A1 | 10/2011 | Atkins et al. | |

FOREIGN PATENT DOCUMENTS

| | | |
|---|---|---|
| EP | 0595513 A2 | 4/1994 |
| TW | 201106346 A | 2/2011 |

OTHER PUBLICATIONS

Kant, Rishi, "Mechatronics in Storage Technology", IEEE Transactions on Components, Packaging, and Manufacturing Technology—Part C, Vol. 20, No. 1, Jan. 1997 pp. 21-30.

* cited by examiner

*Primary Examiner* — Phillip A Johnson
(74) *Attorney, Agent, or Firm* — Joan Pennington

(57) ABSTRACT

A method and structures are provided for implementing a low profile sliding drawer used in information technology equipment (ITE). A low-profile slide mechanism having a substantially horizontal cross section telescopes outwardly a predefined length and includes a plurality of rail sections that are interconnected with shouldered T pins, with sliding of the rail sections occurring on the T pin shoulders spacing apart the rail sections from an associated base pan and drawer. Each of the rail sections is movable a set amount of an overall length of the slide mechanism. The low-profile slide mechanism is friction based and includes different predefined selected materials forming the shouldered T pins and the rail sections to prevent galling and having predefined rigidity and strength.

20 Claims, 7 Drawing Sheets

IMPLEMENTING LOW PROFILE FRICTIONAL SLIDE MECHANISM

FIELD OF THE INVENTION

The present invention relates generally to the data processing field, and more particularly, relates to a method and structures for implementing a low profile slide mechanism used in information technology equipment (ITE).

DESCRIPTION OF THE RELATED ART

High-density information technology equipment (ITE) advantageously is configured to meet the customer's processing and storage requirements. Various components are provided in high-density ITE, such as blade servers, manufactured by International Business Machines Corporation. Blade servers fit in a single chassis like books in a bookshelf and each is an independent server, with its own processors, memory, storage, network controllers, operating system and applications. The blade server simply slides into a bay in the chassis and plugs into a mid-plane or backplane, sharing power, fans, switches, and ports with other blade servers.

Due to the high planar density requirements in information technology equipment, such as known server systems by International Business Machines Corporation of Armonk, N.Y., there is limited space available to place all required features and card components on a base planar.

Due to design requirements limited vertical space is available for a low-profile sliding drawer used in information technology equipment (ITE), computer or server system. For example, limited vertical space is available for the low-profile sliding drawer used for a storage expansion drawer with an extendable direct access storage device (DASD) cage or drawer.

Due to design requirements a vertical slide mechanism can not be incorporated into such a storage expansion drawer. A very stiff low height rail is required. Previous slide rail designs have had problems, for example, with metal particulate and other contaminates both interfering with the slide motion and contaminating electronics in the downstream airflow.

A need exists for an effective method and structures for implementing a low-profile sliding drawer for information technology equipment (ITE).

SUMMARY OF THE INVENTION

Principal aspects of the present invention are to provide a method and structures for implementing a low profile frictional slide mechanism used in information technology equipment (ITE). Other important aspects of the present invention are to provide such method and structures substantially without negative effects and that overcome many of the disadvantages of prior art arrangements.

In brief, a method and structures are provided for implementing a low profile sliding drawer used in information technology equipment (ITE). A low-profile slide mechanism having a substantially horizontal cross section telescopes outwardly a predefined length and includes a plurality of rail sections that are interconnected with shouldered T pins, with sliding of the rail sections occurring on the T pin shoulders spacing apart the rail sections from an associated base pan and drawer. Each of the rail sections is movable a set amount of an overall length of the slide mechanism.

In accordance with features of the invention, the low-profile slide mechanism is friction based and includes different predefined selected materials forming the shouldered T pins and the rail sections to prevent galling and having predefined rigidity and strength.

In accordance with features of the invention, the low-profile slide mechanism includes a base pan receiving a plurality of shouldered T pins in press fit engagement in a base member of the base pan. The plurality of rail sections includes a base pan rail having slots that interface with the shouldered T pins in the base pan and open hems on the sides, a drawer rail having embossed edges that interface with the open hems on the base pan rail sides and slots that interface with a plurality of shouldered T pins mounted in an underside of a drawer. The plurality of shouldered T pins is mounted in press fit engagement in drawer underside. The base pan rail, the drawer rail and the drawer are movable, for example, ⅓ of the overall length of the slide mechanism enabling the drawer to fully extend outwardly its entire length from the base pan.

In accordance with features of the invention, each of the plurality of rail sections provides an extension on a separate individual plane, preventing horizontal bending or binding and also serving as extension stops. The shouldered T pins having shoulders prevent respective rail sections from contacting the base pan and the drawer. By minimizing the points of contact, particulate creation and its affect are minimized.

In accordance with features of the invention, wings are formed on the drawer rail relative to the open hems on the base pan rail sides to reduce rotation of the drawer relative to the base pan, and to reduce the occurrence of rail locking otherwise resulting from the low-profile slide mechanism being biased to one side when the rail sections are moved inwardly.

In accordance with features of the invention, the different predefined selected materials forming the shouldered T pins and the rail sections include, for example, 416 stainless steel (SS) forming the shouldered T pins, 301½ hard SS forming the base pan rail, and cold roll steel (CRS) with a nickel plate forming the drawer rail with the dissimilar materials to prevent galling as the parts ride across each other. The different predefined selected materials forming the shouldered T pins and the rail sections include, for example, machined steel and/or sheet steel. Various different material combinations forming the shouldered T pins and the rail sections can be used.

BRIEF DESCRIPTION OF THE DRAWINGS

The present invention together with the above and other objects and advantages may best be understood from the following detailed description of the preferred embodiments of the invention illustrated in the drawings, wherein.

DETAILED DESCRIPTION OF THE PREFERRED EMBODIMENTS

In the following detailed description of embodiments of the invention, reference is made to the accompanying drawings, which illustrate example embodiments by which the invention may be practiced. It is to be understood that other embodiments may be utilized and structural changes may be made without departing from the scope of the invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

In accordance with features of the invention, a method and structures are provided for implementing a low profile frictional slide mechanism used in information technology equipment (ITE). The low profile frictional slide mechanism has a substantially horizontal cross section that telescopes outwardly and includes a plurality of rail sections. Sections of the low profile frictional slide mechanism are interconnected with shouldered T pins, with sliding occurring on the shoulders so that the sections do not touch each other.

Figure 1:
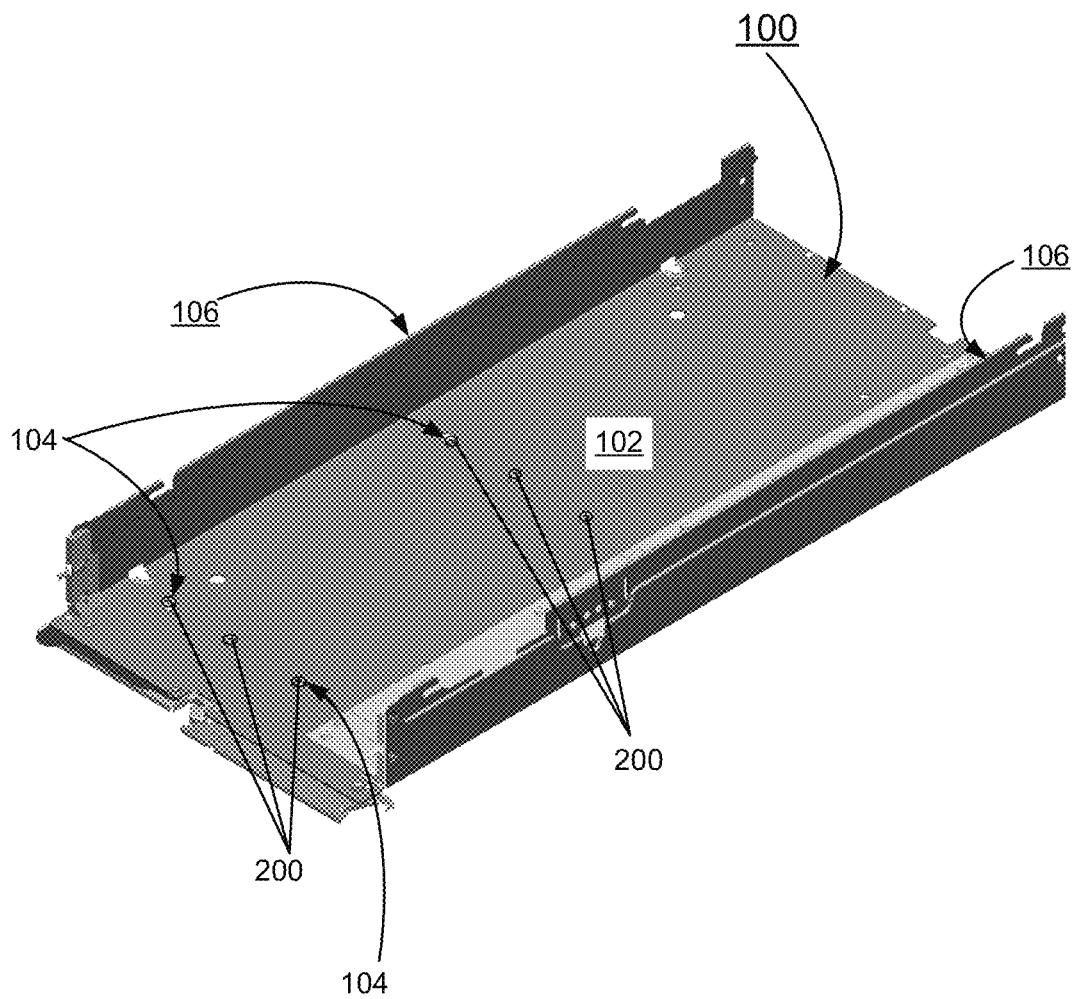
FIG. 1 is a perspective view not to scale schematically illustrating an example base pan for implementing a low profile frictional slide mechanism in accordance with the preferred embodiment.

Referring now to FIG. 1, there is schematically shown an example base pan generally designated by the reference character 100 in accordance with the preferred embodiment for implementing a low profile frictional slide mechanism, for example, as illustrated and described with respect to FIGS. 2-7.

Figure 2:
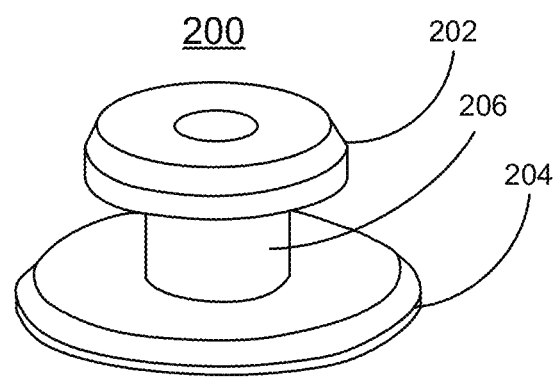
FIG. 2 is a perspective view not to scale schematically illustrating an example shouldered T pin for implementing the low profile frictional slide mechanism in accordance with the preferred embodiment.

The base pan 100 includes a generally rectangular base member 102 with a plurality of apertures 104 receiving a corresponding plurality of shouldered T pins, for example, the shouldered T pin 200, as illustrated and described with respect to FIG. 2. The shouldered T pins 200 are mounted, for example, in press fit engagement in the base member 102. The base pan 100 includes opposed sidewalls generally designated by the reference character 106 and open front and rear portions.

Referring now to FIG. 2, there is schematically shown an example shouldered T pin generally designated by the reference character 200 for implementing the low profile frictional slide mechanism in accordance with the preferred embodiment. The shouldered T pin 200 is a unitary member including an upper shoulder portion 202, a lower portion 204, and a central portion 206 separating the upper shoulder portion 202 and the lower portion 204. For example, the lower portion 204 of the shouldered T pins 200 is press fit in the base member 102 with the upper shoulder portion 202 to retain a base pan rail spaced apart from the base pan 100, for example, the base pan rail 300, as illustrated and described with respect to FIG. 3.

Figure 3:
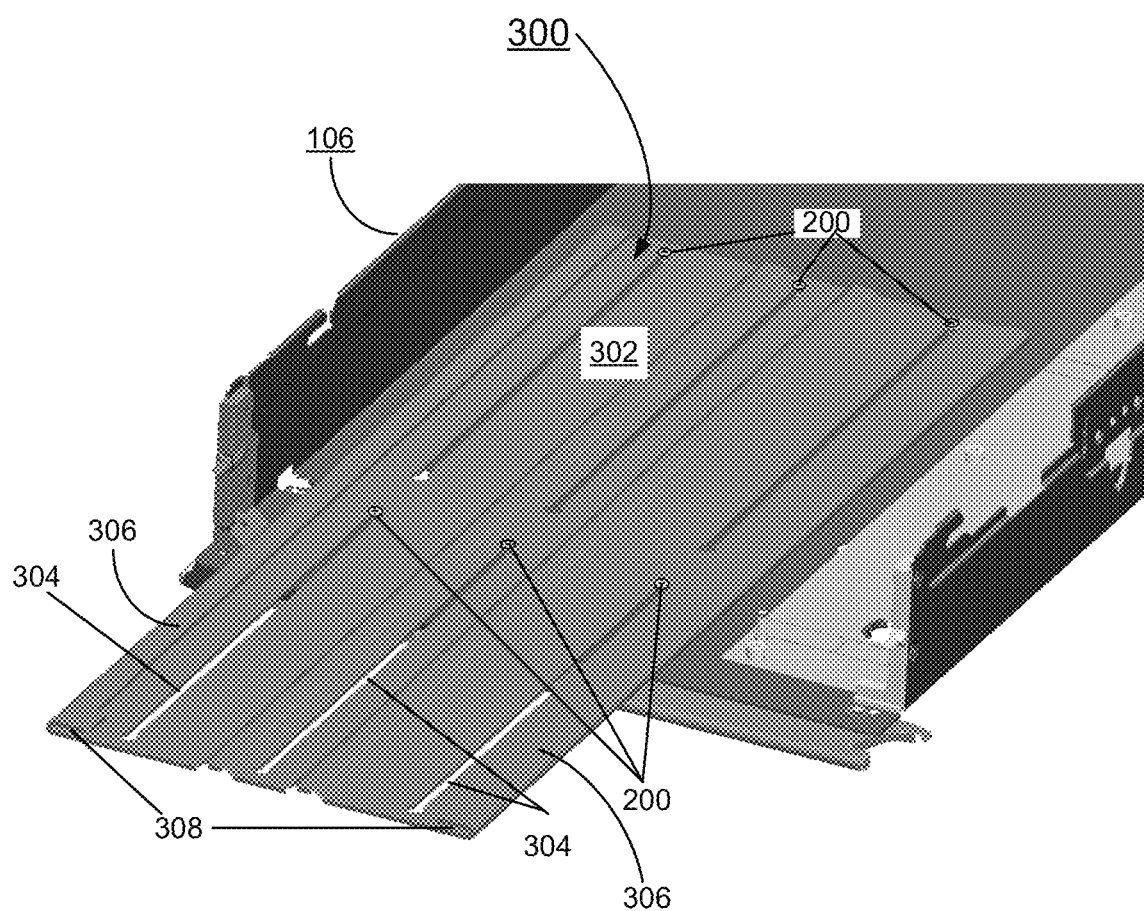
FIG. 3 is a perspective view not to scale schematically illustrating an example base pan rail with the base pan of FIG. 1 and a plurality of shouldered T pins of FIG. 2 for implementing the low profile frictional slide mechanism in accordance with the preferred embodiment.

Referring also to FIG. 3, there is schematically shown an example base pan rail generally designated by the reference character 300 retained and spaced apart from the base pan 100 by a plurality of shouldered T pins 200 for implementing the low profile frictional slide mechanism in accordance with the preferred embodiment. The base pan rail 302 includes a generally rectangular base member 302 of substantially horizontal cross section with a plurality of elongated slots 304 that receive and interface with the shouldered T pins 200 in the base pan 100. The base pan rail 300 includes open hems 306 on its opposite sides. The open hems 306 of the base pan rail 300 have an open front 308 and interface with a drawer rail, for example, the drawer rail 400, as illustrated and described with respect to FIGS. 4 and 5.

Figure 4:
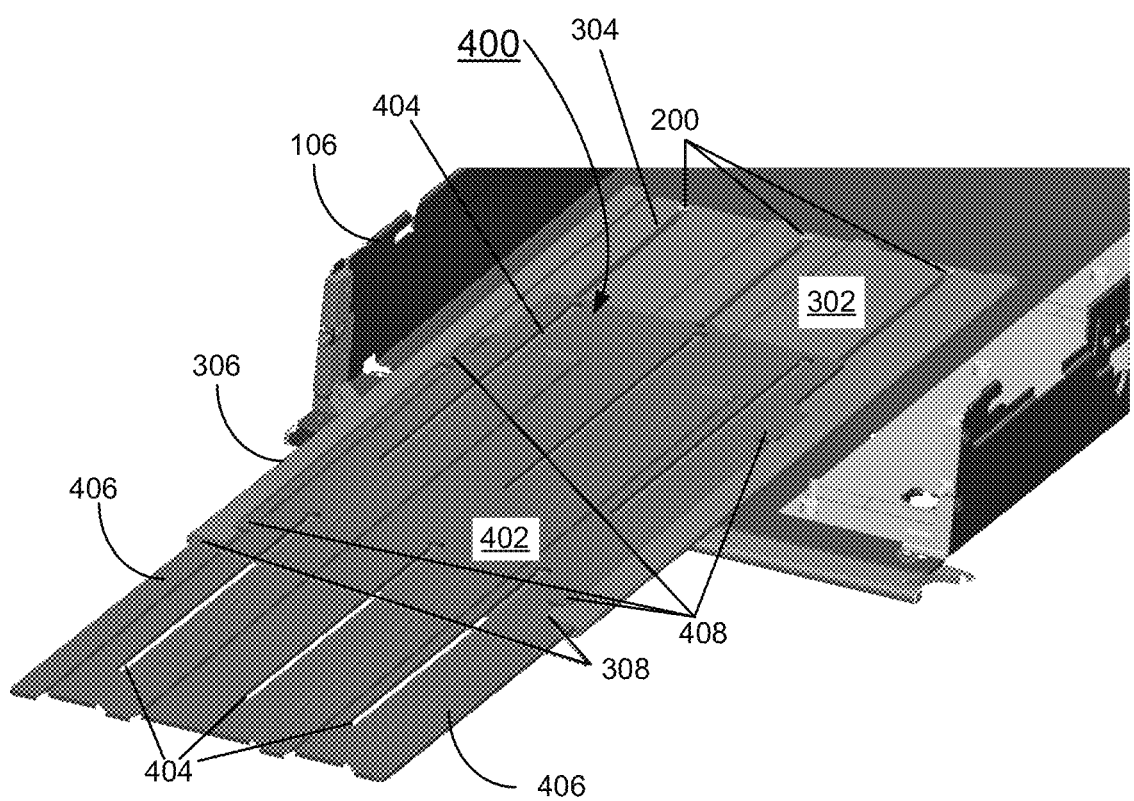
FIG. 4 is a perspective view not to scale schematically illustrating an example drawer rail with the base pan rail of FIG. 3 and a fragmentary portion the base pan of FIG. 1 and shouldered T pins of FIG. 2 for implementing the low profile frictional slide mechanism in accordance with the preferred embodiment.

Referring also to FIG. 4, there is schematically shown an example drawer rail generally designated by the reference character 400 with the base pan rail 300 and a fragmentary portion the base pan 100 and shouldered T pins 200 for implementing the low profile frictional slide mechanism in accordance with the preferred embodiment. The drawer rail 400 includes a generally rectangular base member 402 of substantially horizontal cross section with a plurality of elongated slots 404 that receive and interface with a plurality of shouldered T pins 200 in a drawer, for example, the drawer 600, as illustrated and described with respect to FIGS. 6 and 7.

The drawer rail 400 includes embossed edges 406 that interface with the open hems 306 on opposite sides the base pan rail 300. The embossed edges 406 are received within the open hems 306 with the associated shouldered T pins 200 mounted in the drawer 600 preventing contact of the drawer rail 400 and the drawer 600. The drawer rail 400 includes a plurality of wings 408 that interface with the open hems 306 to reduce rotation and side to side frictional locking of the rails 300, 400 and to reduce rotation of the drawer 600 relative to the base pan 100.

Figure 5:
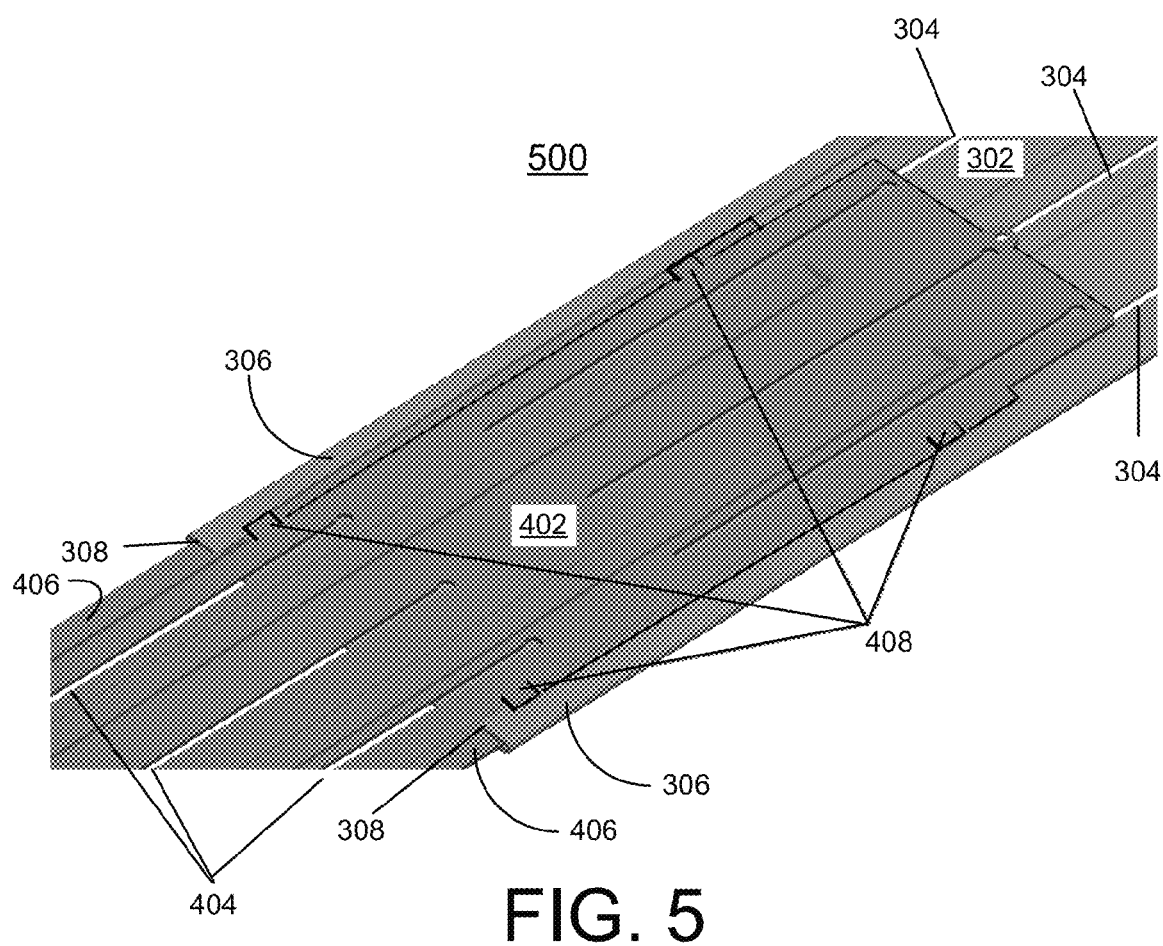
FIG. 5 is a fragmentary perspective view not to scale schematically illustrating wings formed on the drawer rail relative to open hems on the base pan rail sides of FIG. 4 for implementing the low profile frictional slide mechanism in accordance with the preferred embodiment.

Referring also to FIG. 5, a fragmentary perspective view of the drawer rail 400 and the base pan rail 300 generally designated by the reference character 500 further illustrates the wings 408 formed on the drawer rail 400 relative to open hems 306 on the base pan rail 300 in accordance with the preferred embodiment. A respective pair of the wings 408 is provided near the opposed sides of the base member 402. The pairs of the wings 408 are spaced apart along a length of the base member 402 formed inwardly from the embossed edges 406 and positioned for interfacing with the open hems 306 on the opposite sides of base pan rail 300 to reduce rotation and side to side frictional locking.

Figure 6:
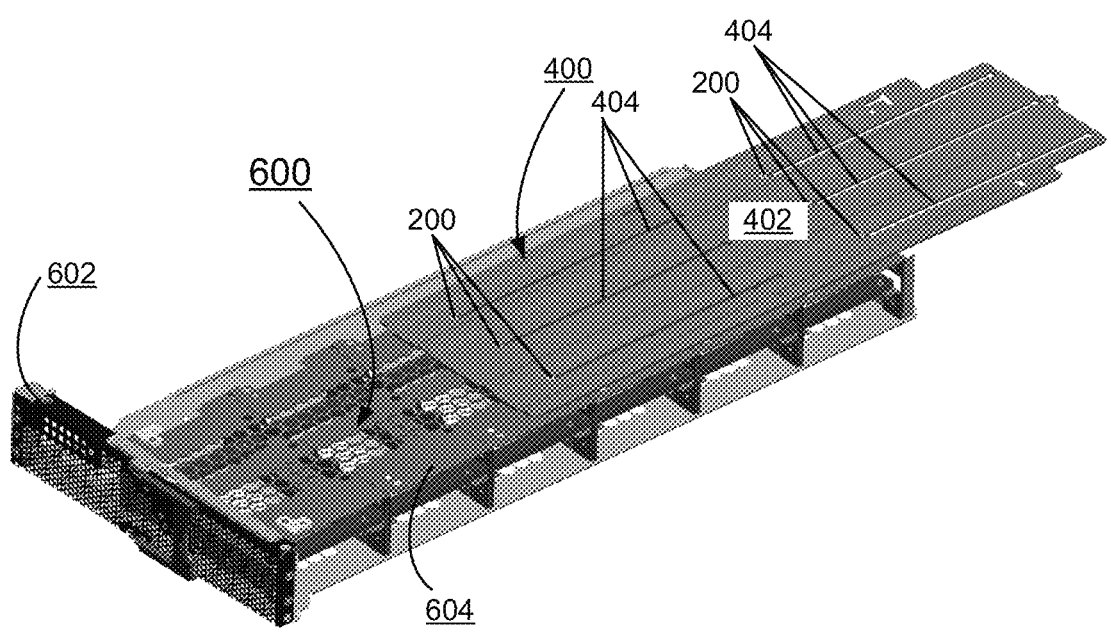
FIG. 6 is an underside perspective view not to scale schematically illustrating an example drawer with the drawer rail of FIGS. 4 and 5 for implementing the low profile frictional slide mechanism in accordance with the preferred embodiment.

Referring now to FIG. 6, there is shown an example drawer generally designated by the reference character 600 with the drawer rail 400 of FIGS. 4 and 5 for implementing the low profile frictional slide mechanism in accordance with the preferred embodiment. The drawer 600 includes a front panel generally designated by the reference character 602 and a drawer underside generally designated by the reference character 604. A plurality of shouldered T pins 200 is mounted in press fit engagement in the drawer underside 604 similar to the shouldered T pins 200 mounted in the base pan 100. The drawer rail 400 is retained and spaced apart from the drawer 600 by the plurality of shouldered T pins 200 for implementing the low profile frictional slide mechanism in accordance with the preferred embodiment.

Figure 7:
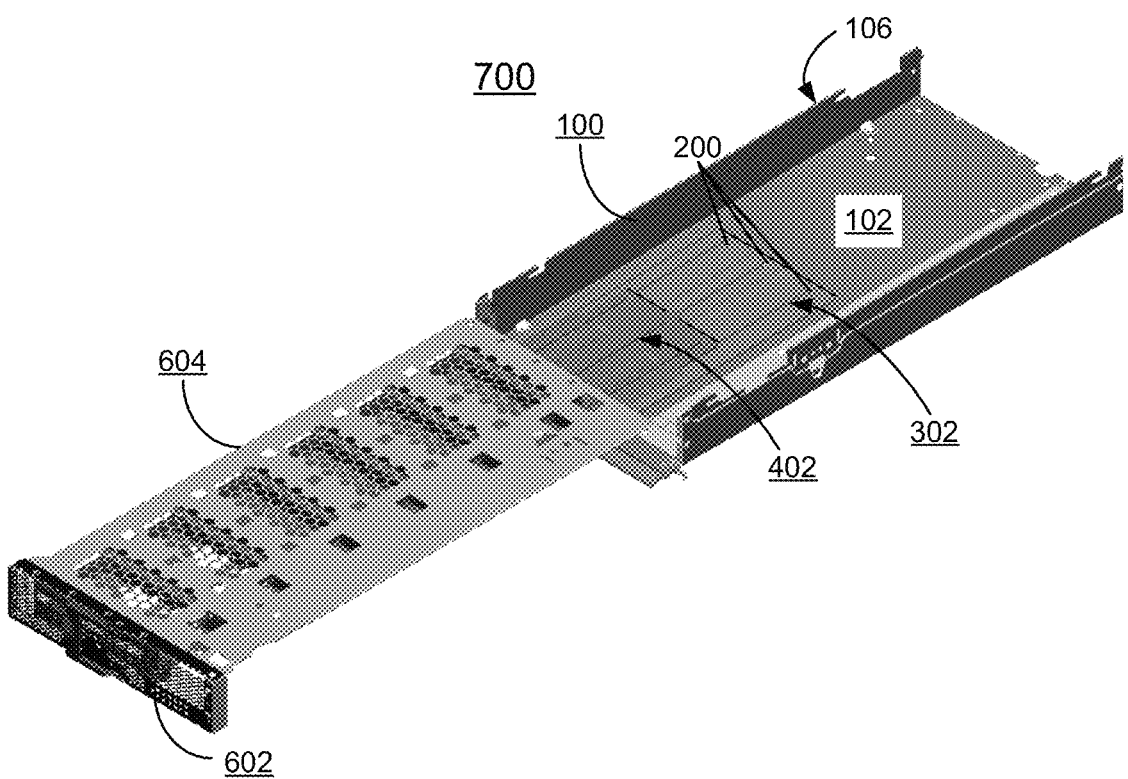
FIG. 7 is a perspective view not to scale schematically illustrating an example complete low profile frictional slide mechanism with the drawer fully extended outwardly from the base pan of FIG. 1 in accordance with the preferred embodiment.

Referring also to FIG. 7 is a perspective view not to scale schematically illustrating an example complete low profile frictional slide mechanism generally designated by the reference character 700 with the drawer 600 fully extended outwardly from the base pan 100 in accordance with the preferred embodiment. The base pan rail 300, the drawer rail 400 and the drawer 600 are movable, for example, by ⅓ of the overall length of the slide mechanism 700 enabling the drawer 600 to fully extend outwardly its entire length from the base pan 100.

Each of the plurality of rail sections 300, 400, 600 provides an extension on a separate individual plane, preventing horizontal bending or binding and also serving as extension stops. The shouldered T pins 200 having shoulders 202 prevent the respective rail sections 300, 400 from contacting the base pan 100 and the drawer 600. In accordance with features of the invention, by minimizing the points of contact, particulate creation and its affect are minimized in the low profile frictional slide mechanism 700 in accordance with the preferred embodiment.

Different predefined selected materials form the shouldered T pins 200 and the rail sections 300, 400 that include, for example, 416 stainless steel (SS) forming the shouldered T pins 200, 301 ½ hard SS forming the base pan rail 300, and cold roll steel (CRS) with a nickel plate forming the drawer rail 400. The dissimilar materials are provided to prevent galling as the parts ride across each other. The different predefined selected materials include, for example, machined steel and/or sheet steel. Various different material combinations forming the shouldered T pins 200 and the rail sections 300, 400 can be used.

While the present invention has been described with reference to the details of the embodiments of the invention shown in the drawing, these details are not intended to limit the scope of the invention as claimed in the appended claims.

What is claimed is:

1. A structure for implementing a sliding information technology equipment (ITE) drawer having limited vertical space comprising:
    a slide mechanism having a substantially horizontal cross section telescoping outwardly a primed length;
    said slide mechanism including a plurality of rail sections and a plurality of shouldered T pins; each of the plurality of rail sections providing a slide mechanism extension on a separate individual plane;
    said plurality of rail sections being interconnected together with said shouldered T pins; each of said rail sections being slidably moved a set amount of an overall length of said slide mechanism, and said rail sections sliding relative to each other and respectively spaced apart from an associated base pan and the sliding ITE drawer.

2. The structure as recited in claim 1 wherein said shouldered T pins and said plurality of rail sections are formed of different materials to prevent galling and said different materials having predefined rigidity and strength.

3. The structure as recited in claim 2 wherein said different materials include stainless steel (SS) materials, and cold roll steel (CRS) materials.

4. The structure as recited in claim 1 wherein said associated base pan includes said shouldered T pins mounted in press fit engagement in said base pan, and the sliding ITE drawer includes said shouldered T pins mounted in press fit engagement in the sliding ITE drawer.

5. The structure as recited in claim 4 wherein said plurality of rail sections includes a base pan rail interfacing with said shouldered T pins mounted in said associated base pan and a drawer rail interfacing with said shouldered T pins mounted in the sliding ITE drawer.

6. The structure as recited in claim 5 wherein said base pan rail and said drawer rail are formed of machined steel.

7. The structure as recited in claim 5 wherein said base pan rail and said drawer rail are formed of sheet metal.

8. The structure as recited in claim 5 wherein said base pan rail having slots interfacing with said shouldered T pins mounted in said base pan.

9. The structure as recited in claim 5 wherein said drawer rail having slots interfacing with said shouldered T pins mounted in the sliding ITE drawer.

10. The structure as recited in claim 5 wherein said base pan rail includes open hems on opposite sides of said base pan rail and said drawer rail have embossed edges interfacing with said open hems on said base pan rail.

11. The structure as recited in claim 10 wherein said drawer rail includes a plurality of wings formed inwardly from the embossed edges and positioned for interfacing with said open hems on said base pan rail to reduce rotation of the sliding ITE drawer relative to said base pan.

12. The structure as recited in claim 5 wherein each of said base pan rail, said drawer rail and the sliding ITE drawer are movable approximately ⅓ of an overall length of the slide mechanism enabling the sliding ITE drawer to fully extend outwardly its entire length from the base pan.

13. A method for implementing a sliding information technology equipment (ITE) drawer having limited vertical space comprising:
    providing a slide mechanism having a substantially horizontal cross section telescoping outwardly a defined length;
    providing said slide mechanism with a plurality of rail sections and a plurality of shouldered T pins, each of the plurality of rail sections providing a slide mechanism extension on a separate individual plane;
    interconnecting said plurality of rail sections together with said shouldered T pins; each of said rail sections being slidably moved a set amount of an overall length of said slide mechanism, and said rail sections sliding relative to each other and respectively spaced apart from an associated base pan and the sliding ITE drawer.

14. The method as recited in claim 13 wherein providing said slide mechanism with said plurality of rail sections and said plurality of shouldered T pins include forming said rail sections and said shouldered T pins of different materials to prevent galling and said different predefined selected materials having predefined rigidity and strength.

15. The method as recited in claim 13 wherein providing said slide mechanism with said plurality of rail sections and said plurality of shouldered T pins include providing a base pan rail and a drawer rail by forming sheet metal.

16. The method as recited in claim 13 wherein providing said slide mechanism with said plurality of rail sections includes providing a base pan rail having slots for interfacing with said shouldered T pins being mounted in said base pan.

17. The method as recited in claim 13 wherein providing said slide mechanism with said plurality of rail sections includes providing a drawer rail having slots for interfacing with said shouldered T pins being mounted in the sliding ITE drawer.

18. The method as recited in claim 13 wherein providing said slide mechanism with said plurality of rail sections includes providing a base pan rail having open hems on opposite sides of said base pan rail and providing a drawer rail have embossed edges interfacing with said open hems on said base pan rail.

19. The method as recited in claim 18 includes forming a plurality of wings inwardly from said embossed edges and positioned for interfacing with said open hems on said base pan rail to reduce rotation of the sliding ITE drawer relative to said base pan.

20. The method as recited in claim 18 includes slidably moving each of said base pan rail, said drawer rail and the sliding ITE drawer approximately ⅓ of an overall length of the slide mechanism enabling the sliding ITE drawer to fully extend outwardly its entire length from the base pan.

\* \* \* \* \*